United States Patent [19]

Edwards et al.

[11] Patent Number: 4,709,206

[45] Date of Patent: Nov. 24, 1987

[54] OUCH SAVER CIRCUIT TESTER GUIDE AND METHODS OF CONSTRUCTING AND UTILIZING SAME

[76] Inventors: Gene R. Edwards, 1321 Michigan Ave.; Charles W. Anderson, 818 Woodworth, both of Alma, Mich. 48801

[21] Appl. No.: 861,930

[22] Filed: May 12, 1986

[51] Int. Cl.[4] ................. G01R 1/06; G01R 31/02; B25B 7/02

[52] U.S. Cl. ................. 324/158 P; 81/418; 324/72.5; 324/158 F

[58] Field of Search .............. 324/158 F, 158 P, 72.5; 339/97 T; 408/104; 81/418, 426.5

[56] References Cited

U.S. PATENT DOCUMENTS

| | | | |
|---|---|---|---|
| 1,468,169 | 9/1923 | Rundell | 81/426.5 |
| 2,291,413 | 7/1942 | Siebrandt | 81/418 |
| 2,408,045 | 9/1946 | Cottrell | 324/72.5 |
| 3,626,358 | 12/1971 | Klassen | 324/72.5 |
| 3,698,419 | 12/1972 | Tura | 81/418 |

FOREIGN PATENT DOCUMENTS 24739 of 1908 United Kingdom ............... 81/426.5

Primary Examiner—Ernest F. Karlsen

[57] ABSTRACT

A device to be used with a needlepoint electrical circuit tester probe, including, a first member, comprising, a first jaw, a first joint section operably connected to said first jaw, a first handle operably connected to said first jaw; and a second member, comprising a second jaw, a second joint section operably connected to said second jaw, a second handle operably connected to said second jaw; the first and second members have their respective first and second joint sections pivotably connected together; the first and second jaws have operably disposed gripping surfaces having therein transverse concavities such that when the jaws are closed, transverse circular apertures are provided for gripping a wire therein. Additionally, the jaws have provided therein, tapered guide channels for receiving a needlepoint electrical circuit tester.

7 Claims, 4 Drawing Figures

OUCH SAVER CIRCUIT TESTER GUIDE AND METHODS OF CONSTRUCTING AND UTILIZING SAME

BACKGROUND OF THE INVENTION

1. Field of the Invention

The present invention relates generally to pliers, and more specifically to a device which selectively holds certain gauges of wires in jaws provided with guide channels tapered to receive electrical needlepoint circuit tester. The present invention is also to be known as the "Ouch Saver" Circuit Tester Guide.

2. Description of Relevant Art

Generally, when an electrical wire is tested for current, as is done very often with car wiring, the wire is held in one hand while a needlepoint probe is used to pierce the wire's insulative layer. Very often in the course of this procedure, a technician will prick his hand with the needlepoint metal probe. Furthermore, when dealing with bundles of electrical wires, if the technician is distracted, he can very easily lose track of the particular wire being tested. Additionally, if the probe while carrying a current contacts other components, a short may occur.

For the most part, the above problems in testing electrical circuits has gone unsolved. However, several references disclose plier-like devices which have been adapted to a related particular use, however, none teach the present invention. Among these references, the most relevant appears to be U.S. Pat. No. 651,682 issued in 1900 to McClary which discloses pliers having removable side cutting-jaws comprising a first part, a second part pivotably connected to said first part, and first part and second part include a jaw, a handle, a joint section provided with an enlarged cylindrical fulcrum and a cylindrical recess or bearing, said jaws have a shallow recess upon the end next to the fulcrum which gradually increases in depth from said end to a point near the center of its width and from near said center, decreases in depth to its outer end, and upper and lower cutters fitted to said recess having side cutting extensions. U.S. Pat. No. 3,956,950 issued in 1976 to Jamell entitled "ELECTRICAL TOOL", discloses a pair of scissor like members which are pivotally interconnected and include opposed jaw portions, an upper jaw portion provided with a concave passageway along its length, the lower jaw portion is truncated and has a plurality of spaced apart transversly extending grooves formed in it such that when a wire is received into the groove and the jaws are closed said wire forms a circle. This tool is further provided with oppositely disposing cutting edges for cutting the wire as necessary.

It should be noted that while the McClary and Jamell plier-like devices generally have wire manipulating abilities neither is meant to hold an electrical wire for testing. Additionally, neither of these patents disclose a plier-like device which will hold onto an electrical wire on its own accord. Furthermore, neither of these inventions discloses apertures or tapered guide channels for receiving a needlepoint electrical probe.

SUMMARY OF THE INVENTION

The deficiences of the above references with regard to the problems of electrical circuit testers have generally been solved by the present invention, which discloses a plier-like device to be used with needlepoint circuit probes, including, a first member, said first member, comprising, a first jaw, a first joint section fixedly connected to said first jaw, a first handle fixedly connected to said first jaw; and a second member, said second member, comprising, a second jaw, a second joint section fixedly connected to said second jaw, a second handle fixedly connected to said second jaw. It should be noted that said first and second members are single unitary articles of manufacture. Said first and second members have said respective first and second joint sections and are pivotably joined together, said first and second jaws are provided with gripping surfaces which are disposed so as to be able to operably engage with one and another, said gripping surfaces are further provided with a plurality of transverse concavities which align when said gripping surfaces are brought into operable engagement to form substantially circular transverse openings, and said plurality of substantially circular transverse openings formed when said first and second jaws are brought into operable engagement have a plurality of differing diameters. Additionally, said first and second jaws have a substantially orthogonal relationship to said plurality of transverse concavities provided in said gripping surfaces of said first and second jaws, said channels are of a predetermined size for receiving a needlepoint electrical circuit tester probe, and said channels taper to small apertures which communicate with said substantially circular transverse openings so as to allow only a small portion of the pointed tips of the electrical probe through, thereby insuring an exact center punch of the wire being tested.

An object of the present invention is to provide a superior quality tool designed for use with common needlepoint circuit testers.

Another object of the present invention is to provide a controlled opening of said jaws for easy one hand control.

Another object of the present invention is to provide transverse openings when said jaws are closed that will easily secure and hold small gauge insulated wires easily for testing with a common needlepoint circuit tester.

Another object of the present invention is to provide a tough and durably constructed device having a long service life, and made of a non-conductive material.

DETAILED DESCRIPTION OF THE PREFERRED EMBODIMENT

Figure 1:
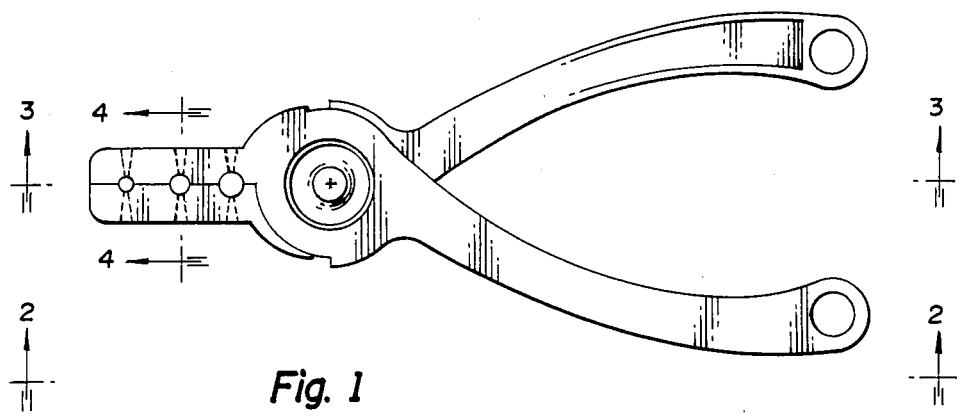
FIG. 1 is a side elevational view of the invention showing how the guide channels taper into the substantially transverse openings.

Turning to FIG. 1, it can be seen that invention 10 is substantially plier-like in appearance. However, noticeably first and second members 12 and 14, which substantially form the handles which operate invention 10 curve towards each other so as to fit easily and comfortably in the user's palm, assuring easy one hand maneuverability. Connected to said first and second members 12 and 14 are first and second joint sections 16 and 18, respectively. First joint section 16 has provided thereon first and second stops 20 and 24. Second joint section 18 has provided thereon first and second stops 22 and 26. When stops 20 and 26, and 22 and 24 come into contact with one and another, the maximum opening of first and second jaws 28 and 30 has been achieved which in the presen embodiment is less than an angle of 45 degrees.

First jaw 28 is fixedly connected to second joint section 18, whereas second jaw 30 is fixedly connected to first joint section 16. It should be noted that, e.g., first member 12 could be understood to include first joint section 16 and second jaw 30 as they are contemplated to be produced as one injection molded hard plastic piece, i.e., a unitary structure; and second member 14, second joint section 18 and first jaw 28 will be produced similarily.

First joint section 16 is solid and has provided thereon outwardly extending side post 44. Second joint section 18 has provided therein an aperture 48 which receives side post 44. It can be seen best in FIG. 3 how side post 44 is received by second joint section 18 and is held thereon by locking washer 46.

Figure 2:
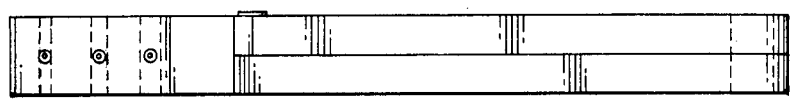
FIG. 2 is a bottom plan view of the invention along line 2—2 of FIG. 1.
Figure 3:
FIG. 3 is a cut in half sectional view of the invention taken along line 3—3 of FIG. 1.

Turning once against to FIG. 1, and first and second jaws 28 and 30 displayed therein, it can be seen that a plurality of tapered guide channels 32 and 34 are provided therein and are indicated by the dotted lines which communicate with substantially circular transverse apertures 36 which according to FIGS. 1-3 are provided in three different sizes for receiving various guages of electrical wiring, now shown. When a wire is held in substantially circular transverse aperture 36, whose length can best be appreciated in FIGS. 2 and 3, a needlepoint electrical probe is inserted into the appropriate tapered guide channel 38 or 34 and pierces any insulative layer on said wire. It should be appreciated that an electrical wire devoid of any exterior layer can be tested with the present invention 10 will hold a closed position without the assistance of the user. This is useful in marking the particular wire being tested if the user has any need to move away from the wire, e.g., to activate the wire by turning an ignition key of an automobile.

Figure 4:
FIG. 4 is a cross-sectional of how one of the guide channels tapers into one of the substantially circular transverse openings.

FIG. 4 clearly delineates the tapered guide channels 32 and 34 and the orthogonal relationship they have with substantially circular transverse apertures 36 which are formed when first and second jaws 28 and 30 are in a closed position as in FIG. 1.

It is to be understood that the present invention 10 is not limited to the above statement of the preferred embodiment, and may take on various other forms without departing from the spirit of the invention 10.

We claim:

1. A device to be used with a needlepoint electrical circuit tester probe, comprising, in combination:
   a first member, including:
   a first jaw;
   a first joint section fixedly connected to said first jaw;
   a first handle fiexedly connected to said first jaw;
   a second member, including:
   a second jaw;
   a second joint section fixedly connected to said second jaw;
   a second handle fixedly connected to said second jaw;
   said first and second members have said respective first and second joint sections pivotably connected together;
   said first and second jaws are provided with gripping surfaces;
   said first and second jaws have said gripping surfaces disposed for operable engagement with one another;
   said gripping surfaces of said first and second jaws are provided with a plurality of transverse concavities which align when said gripping surfaces are brought into operable engagement to form substantially circular transverse openings;
   said plurality of substantially circular transverse openings formed when said first and second jaws are brought into operable engagement have a plurality of differing diameters;
   said first and second jaws having provided therein a plurality of tapered guide channels which have a substantially orthogonal relationship to said plurality of transverse concavities provided in said gripping surfaces of said first and second jaws;
   said channels are of a predetermined size for receiving said probe.

2. The device of claim 1, wherein:
   said first handle is downwardly curved; and
   said second handle is upwardly curved.

3. The device of claim 2, wherein:
   said first handle has an indented side surface and an aperture adjacent thereto; and
   said second handle has an indented side surface and an aperture adjacent thereto.

4. The device of claim 3, wherein:
   said first joint section is a substantially circular solid member having a side protrusion of a length slightly in excess of the thickness of said first joint section;
   said second joint section is a substantially circular member having an aperture therein for receiving said side protrusion of said first joint section; and
   means for locking said first and second joint sections together;
   said second joint section having a circular groove for receiving said locking means;
   said locking means causes said first and second members when operated to stiffly pivot on said side protrusion of said first section.

5. The device of claim 4, wherein:
   said first and second joint sections have upraised portions which when engaged with one and another, stop said pivotal movement of said first and second member.

6. The device of claim 5, wherein:
   said plurality of channels taper to a predetermined narrowness as they approach said substantially circular transverse concavities in said first and second jaw sections.

7. The method of using a device to be used with a needlepoint electrical circuit tester probe, comprising, in combination:
   a first member, including:
   a first jaw;
   a first joint section fixedly connected to said first jaw;
   a first handle fixedly connected to said first jaw;
   a second member including:
   a second jaw;
   a second joint section fixedly connected to said second jaw;
   a second handle fixedly connected to said second jaw;
   said first and second members have said respective first and second joint sections pivotably connected together;

said first and second jaws are provided with gripping surfaces;

said first and second jaws have said gripping surfaces disposed for operable engagement with one another;

said gripping surfaces of said first and second jaws are provided with a plurality of transverse concavities which align when said gripping surfaces are brought into operable engagement to form substantially circular transverse openings;

said plurality of substantially circular transverse openings formed when said first and second jaws are brought into operable engagement have a plurality of differing diameters;

said first and second jaws having provided therein a plurality of tapered guide channels which have a substantially orthogonal relationship to said plurality of transverse concavities provided in said gripping surfaces of said first and second jaws;

said channels are of a predetermined size for receiving said probe, said method comprising:

manipulating said first and second jaws around a wire;

grasping the wire in a substantially circular transverse aperture;

inserting a needlepoint electrical circuit tester probe into the tapered guide channel orthogonal to said wire; and moving said needlepoint electrical circuit tester probe into contact with said wire.

* * * * *